United States Patent [19]
Hermansson

[11] Patent Number: 5,814,546
[45] Date of Patent: Sep. 29, 1998

[54] METHOD FOR PRODUCING A BIPOLAR SEMICONDUCTOR DEVICE HAVING SIC-BASED EPITAXIAL LAYER

[75] Inventor: Willy Hermansson, Västerås, Sweden

[73] Assignee: ABB Research Ltd., Zurich, Switzerland

[21] Appl. No.: 742,937

[22] Filed: Nov. 1, 1996

[51] Int. Cl.$^6$ .................................................. H01L 21/8222
[52] U.S. Cl. .................... 438/309; 438/320; 438/931; 148/DIG. 18; 148/DIG. 148
[58] Field of Search .................... 438/133, 309, 438/919, 320, 931, 293, 369; 148/DIG. 10, DIG. 11, DIG. 18, DIG. 148

[56] References Cited

U.S. PATENT DOCUMENTS

| | | | |
|---|---|---|---|
| 3,988,772 | 10/1976 | Krishna | 357/64 |
| 4,752,818 | 6/1988 | Kushida et al. | 357/38 |
| 5,063,421 | 11/1991 | Suzuki et al. | 357/17 |
| 5,281,831 | 1/1994 | Uemoto et al. | 257/102 |

FOREIGN PATENT DOCUMENTS 0 430 237 A1  of 1991  European Pat. Off. .

OTHER PUBLICATIONS

Borenstein et al., Influence of ion–implanted titanium on the performance of edge–defined, film–fed grown silicon solar cells, Appl. Phys. Lett. 62(14), Apr. 1993, pp. 1615–1616.

Wondrak et al., Proton Implantation for Silicon Power Devices, Proc of 1988 Int Symp On Power Semiconductor Devices, Tokyo, Japan, pp. 147–152.

Hallen et al., Multiple Proton Energy Irradiation For Improved GTO Thyristors, Solid–State Electronics, vol. 36, No. 2, 1993, pp. 133–141.

Schlangenotto, Schelle Dioden, ETG Conference, Abschaltbare Elemente der Leistungselektronik und ihre Anwendungen, Bad Neuheim, ETG–Report 23, 1988, pp. 50–70.

Semple et al., Proton Irradiated, High Voltage, Fast Recovery Rectifiers Fabricated on Float–Zone Silicon, Power Conversion Proceedings, May 1996, pp. 451–455.

Son et al., The Lifetime Limiting Defect in SiC Int Phys Conf Ser No. 141, Chapter 4, 1995, pp. 405–410, Paper presented at Int Symp Compound Semicond, San Diego, Sep. 1994.

Wang et al., Mechanisms Limiting Current Gain in 6H–SiC Bipolar Transistors, ICSCRM '95, Kyoto, Japan 1995, pp. 591–592.

Strel'chuk, Lifetimes and Diffusion Lengths of Nonequilibrium Charge Carriers in SiC P–N Structures, Semiconductors, vol. 29, Jul. 1995, pp. 614–623.

Son et al., Dominant Recombination Center in Electronirradiated 3C SiC, Jour Appl Phys, vol. 79, No. 7, Apr. 1996, pp. 3784–3786 American Institute of Physics.

Kordina et al., The Minority Carrier Lifetime of N–Type 4H–and 6H–SiC Epitaxial Layers, Appl Phys Lett 60,(5), Jul. 29, 1996, pp. 679–681.

*Primary Examiner*—John Niebling
*Assistant Examiner*—Long Pham
*Attorney, Agent, or Firm*—Pollock, Vande Sande & Priddy

[57] ABSTRACT

A method for producing a bipolar semiconductor device having a first layer doped according to a first doping type, the first layer being adapted to have minority charge carriers injected thereinto from a second layer of the device of a doping type opposite to that of the first layer in a forward conducting state of the device, comprises the steps of a) epitaxially growing the first layer and b) providing at least one region of the first layer with the minority charge carriers having a lifetime lower than in other parts of the first layer, the lower lifetime region of the first layer being formed directly during the epitaxial growth of this region by changing composition of substances fed to the first layer for the growth thereof when the region is grown.

18 Claims, 2 Drawing Sheets

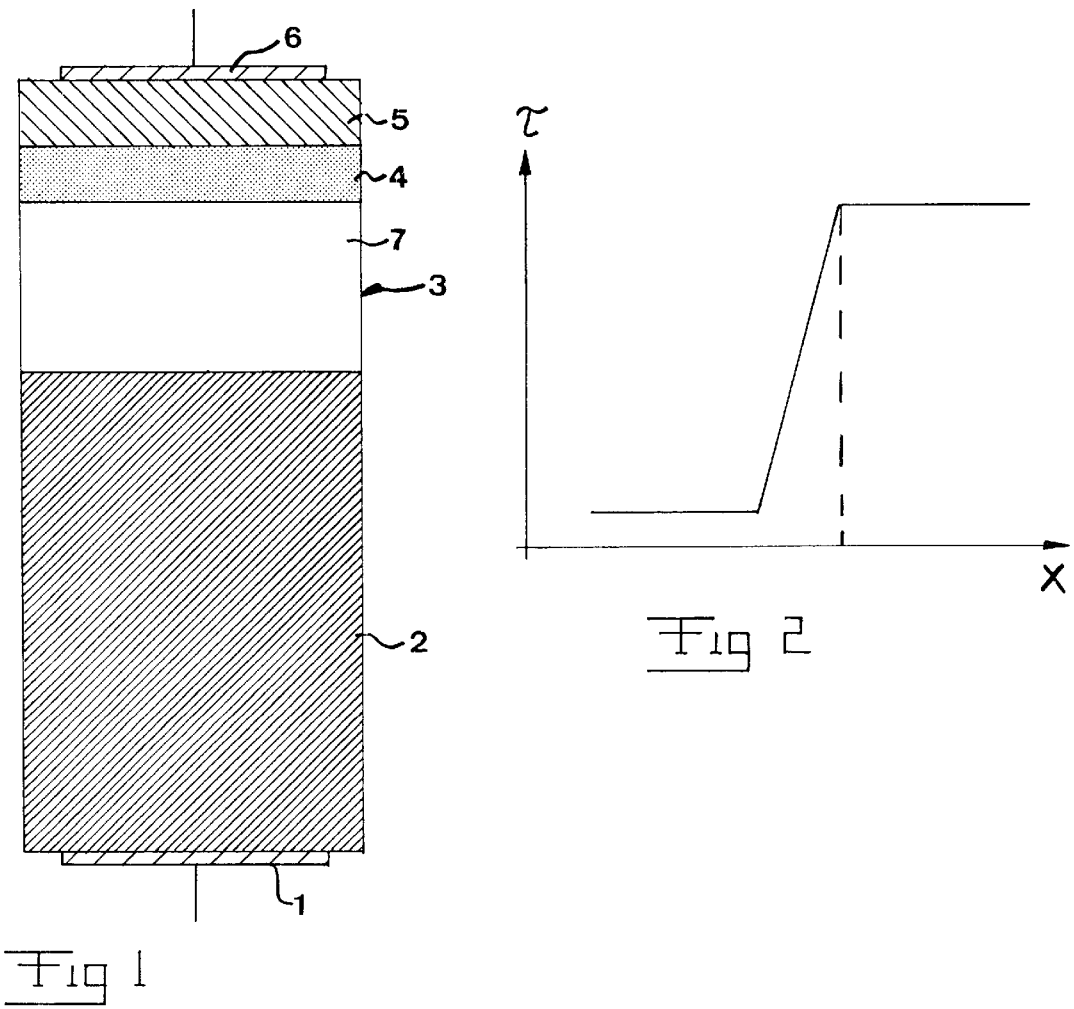
Fig 1
Fig 2
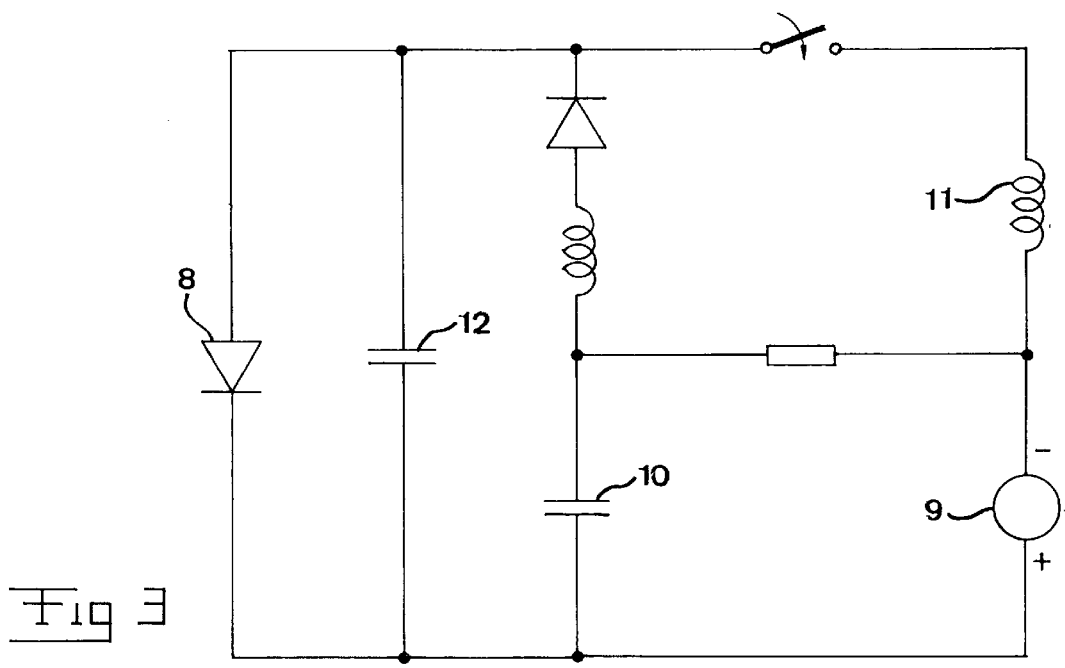
Fig 3

METHOD FOR PRODUCING A BIPOLAR SEMICONDUCTOR DEVICE HAVING SIC-BASED EPITAXIAL LAYER

TECHNICAL FIELD

The present invention relates to a method for producing a bipolar semiconductor device having a first layer doped according to a first doping type being one of n or p, the first layer being adapted to have minority charge carriers injected thereinto from a second layer of the device of an opposite doping type to that of the first layer in a forward conducting state of the device. The method comprises the step of a) epitaxially growing the first layer and b) providing at least one region of the first layer with a constitution implying a lower lifetime of the minority charge carriers therein than in other parts of the first layer, as well as a bipolar semiconductor device.

BACKGROUND OF THE INVENTION

The invention relates to all types of bipolar semiconductor devices, as diodes, thyristors, BJTs and IGBTs, which have the common feature that minority charge carriers are injected into such a first layer, which normally is a low doped n-type drift layer, in the forward conducting state of the device resulting in an improved V(I)—characteristic of the device, i.e. the device requiring a lower forward voltage for conducting a current of a certain value. However, it is also well known that the presence of these minority charge carriers in the first layer in the case of, for instance, a diode results in a reverse recovery of the device when it is turned off, i.e. switched into the reverse blocking state, which results in a reverse current in the reverse direction of the device during a certain period of time, the so called reverse recovery time, causing energy losses which may lead to cooling problems. In the case of a device of the type which is turned off like a GTO or an IGBT, the presence of the minority charge carriers in the first layer results in a so-called tail current in the forward direction upon turning off the device. This current also creates energy losses.

Accordingly, there is a trade-off between conduction on-state losses, and switching or turn-off losses in such bipolar semiconductor devices, and the growth of the first layer is normally carried out so as to obtain the highest possible lifetime for the minority charge carriers therein, and there by the possibility to obtain as low conduction on-state losses as possible. It is known to use different techniques to there after reduce the lifetime of the minority charge carriers in the first layer, or at least a region thereof for obtaining faster recombination of the minority charge carriers when the device is turned off, or switched in the reverse blocking state, and thereby that lower switching losses. However this will, at the same time, as mentioned, affect the plasma formed by the minority charge carriers in the forward conducting state of the device and thereby cause an increase of the conduction on-state losses. However, these methods of lowering the lifetime have the advantage that the uniformity of the lifetime is increased with respect to the conditions prevailing in the first layer after the growth thereof.

It is known in the art to introduce Au- or Pt-atoms into such a first layer of bipolar semicondutor devices of silicon by high temperature diffusion thereinto for creating recombination centers therein. However, this method is rather complicated to carry out and make it comparatively difficult to control the process and obtain a uniformity of concentration of the atoms and thereby a well-defined minority charge carrier lifetime in said region of said first layer. This method also has a severe restriction, because it may only be used for materials in which the atoms to be introduced have a comparatively high diffusivity, so that it may, for instance, not be used for SiC-devices where the diffusitivity is very low.

It is also known to use electron irradiation as a means of minority charge carrier lifetime control, and this technology provides a clean and simple process with greater control and uniformity than can be achieved by the impurity diffusion process. The main disadvantage of this irradiation is that the radiation-induced recombination centers tend to anneal out after a period of time, not only but particularly when, the device is subjected to high temperatures. This electron irradiation has hitherto been carried out, so that it has changed the lifetime homogeneously throughout the device thickness.

It is also known to use proton irradiation for causing damages of a restricted region of the first layer for obtaining a localized low lifetime region thereby reducing the switching losses of bipolar devices but not significantly lowering the conduction on-state losses. However, this proton irradiation has several disadvantages. It is difficult to obtain a homogenous influence of the whole region, in which the lifetime is to be lowered. Furthermore, it is associated with high cost to provide a source of proton irradiation. It is also difficult to reach regions located deeper into a device, especially in hard irradiation materials, such as SiC.

SUMMARY OF THE INVENTION

The object of the present invention is to provide a method for producing a bipolar semiconductor device as defined in the introduction, which solves the problems adhered to the methods discussed above.

This object is obtained by forming the lower lifetime region of the first layer directly during the epitaxial growth of this region during step a) by changing the composition of the substances fed to the first layer for the growth thereof when the region is grown. This means that a localised low lifetime region may be obtained without the need of any source of proton irradiation, or the like, thereby simplifying the process considerably. Furthermore, it is possible to obtain an excellent uniformity of the lifetime in the region if so desired. It also is easy to chose any desired location for the region to provide the best device performance, and the thickness (depth) of the lower lifetime region can easily be controlled during the epitaxial growth process. Another advantage of this method is that no high diffusivity of any element in the material of the first layer is necessary for obtaining recombination centers in the region.

According to a preferred embodiment of the invention, the region is formed by incorporating impurities therein during the growth thereof. An advantage of this method is that no high diffusivity of the impurities in the material of the first layer is necessary to obtain incorporation of the impurities forming recombination centers in the region.

According to another preferred embodiment of the invention, the ratio of those of these substances that contain the basic elements for the growth of the first layer is changed during this growth while the region is grown. This is an easy and efficient way to influence the lifetime of the minority charge carriers in the region, and this results in a lower quality of the region and thereby a lower lifetime. "The term basic elements" is defined as the elements participating in forming the basic structure of the grown material, so that they will, for example, in the case of growing SiC, be Si and C.

According to another preferred embodiment of the invention, the region is formed by incorporating impurities during the growth of a certain thickness of the first layer, so that the region will be a sub-layer of the first layer having a lower lifetime of the minority charge carriers. A well defined such sub-layer, having a lower minority charge carrier lifetime, may thereby be simply realized by carrying out the method according to the invention.

According to another preferred embodiment of the invention concerning a method for obtaining a device in which the second layer is located next to the first layer, the lower lifetime region is grown in a part of the first layer located close to the second layer. It has been shown that this location of said region is very advantageous. Such a localised lower lifetime region will only increase the conduction on-state losses of a device so produced to a comparatively small extent, however the switching losses will be reduced considerably. This is due to a strongly enhanced recombination rate of minority charge carriers present in the first layer in the region when the device is turned off or switched to be reversed biased. This which reduces the charge, i.e. the tail current, to flow until the steady-state is reached in a device turned off, and the charge which has to flow in the reverse direction after reverse biasing a device until the steady reverse blocking state is reached. Furthermore, in the latter case, the device will start to block at a comparatively lower reverse current than without this lower lifetime region reducing the switching losses. A further factor is that the reverse current will, after the blocking state has been reached, decrease slowly, so that a very "soft" reverse recovery is obtained. This of great importance when this current has to be led through an inductance.

According to another preferred embodiment of the invention, the first layer is provided with a lifetime of the minority charge carriers varying throughout said first layer. It will in this way, be possible to give different regions of the first layer exactly the minority charge carrier lifetime desired for each particular device, and adapted for the later task of the device in question.

According to another very preferred embodiment of the invention, at least the first layer is produced by epitaxially growing SiC. The method, according to the invention, is particularly well suited for producing a bipolar semiconductor device with at least one region of said first layer provided with a constitution implying a lower lifetime of the minority charge carriers therein when the first layer is made of SiC, since the low diffusivity of most elements in SiC, also at comparatively high temperatures, (which is a disadvantage when trying to obtain a lower lifetime region by the impurity diffusion process discussed above and which makes it impossible to use that process for SiC), here is instead turned into an advantage. Thus, since the recombination centers formed through the incorporation of said impurities into the SiC-layer will still be there also if the device is excerted to very high temperatures thanks to the low diffusivity of such impurities in SiC.

It is also an object of the present invention to provide a bipolar semiconductor device according to the preamble of the appended independent device claim having a good trade-off between conduction on-state losses and switching losses with respect to such devices already known.

This object is, according to the invention, obtained by providing such a device, in which the lower lifetime region of the first layer has another composition than the other parts of the first layer, the composition being obtained during an epitaxial growth of this region. The advantages of such a semiconductor device will be apparent from the above discussion of the method according to the invention.

According to a preferred embodiment of the invention at least the first layer of the device is of SiC. Such a device has particular advantages with respect to prior art devices of this type.

Further advantages and preferred features of the invention will appear from the following description and the claims.

BRIEF DESCRIPTION OF THE DRAWINGS

With reference to the appended drawings, below follows a specific description of a preferred embodiment of the invention cited as an example.

In the drawings:

FIG. 1 is a schematic cross-section view through a rectifying diode produced through a method according to the invention, FIG. 2 is a graph showing how the lifetime of minority charge carriers changes in the thickness direction of the diode in FIG. 1, FIG. 3 is a view of an electrical circuit in which the diode shown in FIG. 1 may be incorporated and for which simulations have been done for comparison with a circuit having a similar diode without any lower lifetime region in the first layer.

DETAILED DESCRIPTION OF A PREFERRED EMBODIMENT(S)

Figure 4:
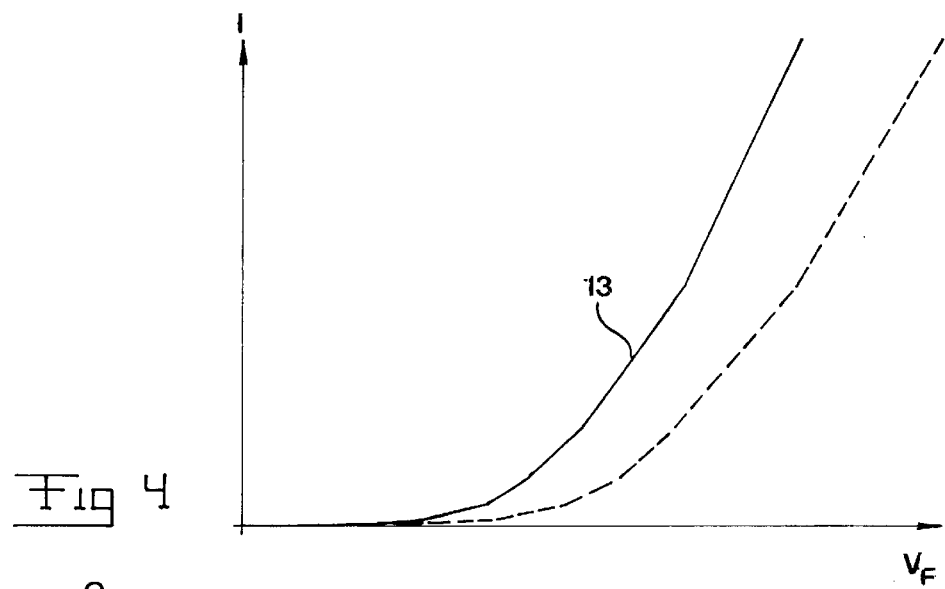
FIG. 4 is a graph of the current versus voltage in the forward conducting state of two diodes having different minority charge carrier lifetimes in the drift layer thereof.

FIG. 1 illustrates a rectifying diode, to which the invention is applied. All semiconductor layers of this diode is made of SiC, and this diode and the features thereof will hereinafter be explained to describe the invention and its advantages, since the invention is particularly advantageous in the SiC-case, but it is emphasised that the not to be considered as being restricted to this semiconductor material. FIG. 1 is a very simplified view of the device, in which passivation layers, etc. having nothing to do with the invention have been omitted. The diode has superimposed a cathode 1, a comparatively thick highly doped n-type substrate layer 2, with a thickness of 50 $\mu$m and a doping concentration of $3 \times 10^{18} cm^{-3}$; a low doped n-type drift layer 3 having a total thickness of 30 $\mu$m, and a doping concentration of $2 \times 10^{15} cm^{-3}$, the uppermost region of which forms a sub-layer 4 having a lower lifetime of minority charge carriers than the rest of the drift layer and a thickness of 5 $\mu$m; a highly doped p-type layer 5 having a thickness of 5 $\mu$m and a doping concentration of $10^{19} cm^{-3}$ and which forms a pn-junction with the drift layer; and finally an anode 6. In the forward conducting state of the diode, the layer 5 functions as a hole emitter and injects minority charge carriers in the form of positive holes into the drift layer 3 thereby forming a plasma therein and improving the conductivity of the device. However, this plasma also gives rise to energy losses when the diode is switched to be biased in the reverse direction.

The different layers 2–5 of this device are epitaxially grown by using the Chemical Vapor Deposition (CVD) technique or developments thereof, such as the High Temperature Chemical Vapour Deposition (HTCVD) technique. The first major part 7 of the drift layer 3 is grown with the aim to keep the minority charge carrier lifetime therein as high as possible. The uppermost part 4 of the drift layer is epitaxially grown while introducing additives reducing the lifetime, so that these are incorporated in the layer 4 during the epitaxial growth. Such impurities are in this case introduced to such a concentration that the minority charge carrier lifetime in the sub-layer 4 will be 10 ns, whereas the minority charge carrier lifetime will be 100 ns in the major part 7 of the drift layer. This is shown in FIG. 2, which illustrates said lifetime τ vs. the device thickness in the drift layer. Accordingly, the minority charge carrier lifetime is thereby varied in the axial direction of the device, so that the method according to the invention is here used to control axially the lifetime profile in the drift layer. The dashed line in FIG. 2 corresponds to the lower limitation of the sub-layer 4.

The impurities incorporated in the sub-layer 4 during the epitaxial growth thereof may be any type of element suitable to lower the lifetime of the minority charge carriers when present in the SiC-layer. Compensation may also be used for lowering the lifetime at a given doping concentration. For instance, N may be incorporated with a concentration of $2 \times 10^{15} cm^{-3}$ and vanadium as a compensating acceptor at a concentration of $10^{15} cm^{-3}$ for obtaining a resulting doping concentration of n-type of $10^{15} cm^{-3}$. Titanium is another good candidate for such a compensating acceptor in SiC.

FIG. 3 illustrates an electrical circuit, in which the SiC-diode 8 is built in, and the function of this switching circuit has been simulated by calculations, and compared with the function thereof, when the diode 8 is replaced by an identical diode except for the absence of the lower lifetime layer 4. This circuit is used to make a simple test of the diode turn-off in a circuit which gives a fairly good model of the situation as a free-wheeling diode in, for example, an IGBT converter. In the simulation, the following circuit data was used: forward current 100 A/cm²; reverse DC voltage at 9 2,8 kV, clamped by the capacitance 10; di/dt for the commutation at turn-off 500 A/cm²μs (controlled by the inductance 11); dV/dt during reverse blocking approximately 5 kV/μs (adjusted by introducing the capacitance 12 into the circuit).

Before commenting upon the results of these simulations, the influence of the minority charge carrier lifetime in the drift layer of a rectifier diode on the forward voltage at a given current through the diode in the forward conducting state thereof will be briefly discussed with reference to FIG. 4. The dashed line corresponds to a diode having a lower minority charge carrier lifetime in the drift layer than a corresponding diode, which then gets a $V_F(I)$-characteristic according to line 13 in FIG. 4. Accordingly, a higher voltage has to be applied over a diode having a lower minority charge carrier lifetime in the drift layer thereof for obtaining a given current through the diode, which will then increase the on-state energy losses of the diode.

Figure 5:
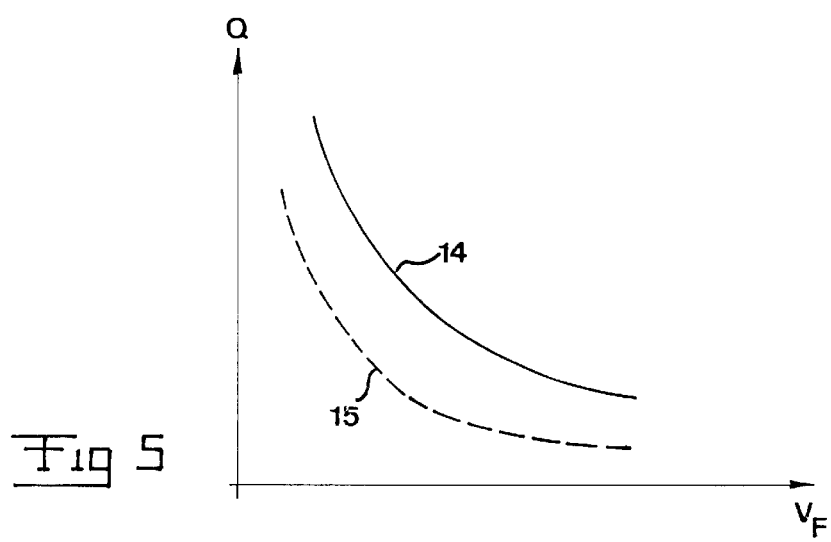
FIG. 5 is a graph of the reverse recovery charge which has to flow in the reverse direction of a diode upon turning-off thereof versus the on-state forward voltage of a diode according to FIG. 1 and a corresponding diode having no lower lifetime region.

FIG. 5 illustrates how the charge Q to be led through the diode in the reverse direction upon turning-off thereof depends upon the forward voltage over the diode for a given current. Line 14 corresponds to a diode according to FIG. 1, but with a homogenous lifetime throughout the entire drift layer. Expressed in another way, it is illustrated how the charge is changed with the minority charge carrier lifetime in the drift layer. Travelling along the curve 14 from the top thereof, and downwardly, will mean going towards lower and lower minority charge carrier lifetimes and at the same time lower switching losses which have to be compensated for by increasing conduction on-state losses.

The simulations referred to above result in the dashed line 15 in FIG. 5 for the diode shown in FIG. 1. Accordingly, it will be possible to obtain a smaller charge to be led in the reverse direction upon turning-off the diode for a given forward voltage when a localized lower lifetime region is placed next to the p-emitter than when the lifetime has been lowered for the entire drift layer. Accordingly, a very good trade off between conduction on-state losses and switching losses may be obtained.

Figure 6:
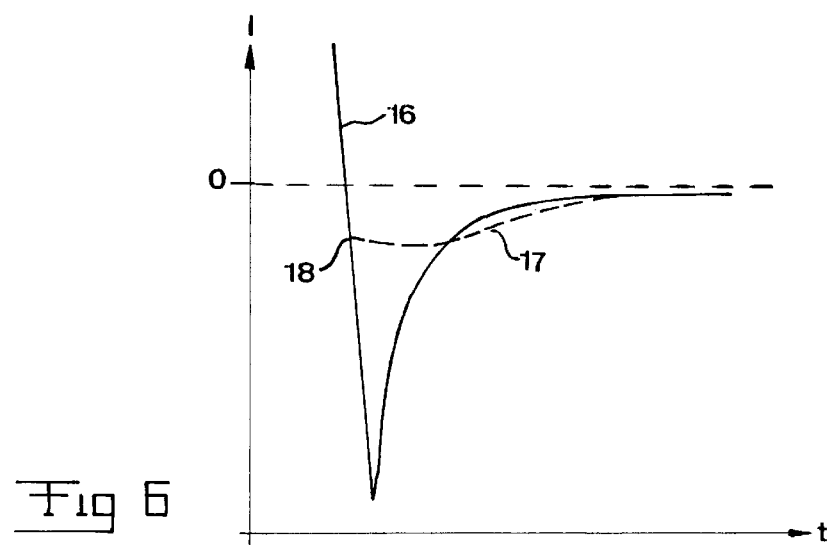
FIG. 6 is a graph of the current through a diode versus the time when it is turned-off for the diodes according to FIG. 5.

The current I through a diode without the lower lifetime layer 4 (curve 16), and of the diode shown in FIG. 1 (curve 17), are illustrated in FIG. 6 as a function of the time elapsed after turning the diode off. The diode will reach the point 18 at which the pn-junction thereof starts to block at a much lower reverse current than in a diode having no such lower lifetime layer. Also, the total charge led through the diode in the reverse direction thereof, after turning off the diode, and thereby turn off the energy loss, will be much lower for the diode according to the invention. A further important characteristic of the curve 17 is that a very "soft" reverse recovery is obtained, i.e. the reverse current decreases comparatively slowly, so that di/dt will be low and thereby no high voltages are created over a possible inductance of the switching circuit through which the current has to flow. The energy losses will be somewhat larger for such an extension of the curve 17 than if it would go faster towards zero from the point 18, but this will mostly be readily accepted, since the problems with a very large di/dt over an inductance may be avoided.

The invention is, of course not in any way restricted to the preferred embodiment described above, but many possibilities to modifications thereof will be apparent to one with ordinary skill in the art.

Although it has been shown in the drawings how the minority charge carrier lifetime is varied in the axial direction of the device, it is within the scope of the invention to vary the lifetime in other directions by incorporating impurities during the epitaxial growth of the first layer, for instance by using so-called regrowth technique.

It is also possible to incorporate different impurities in different parts of the first layer to obtain different lifetimes in these different parts. The concentration of the impurities lowering the lifetime may also be varied so as to vary the lifetime throughout the first layer.

The first layer may be doped according to the p-type as well as according to the n-type. In the first case, electrons will form the minority charge carriers.

All definitions concerning the materials of the different device layers do, of course, also include inevitable impurities as well as intentional doping when SiC is concerned.

The definition layer should be interpreted broadly, and comprises all types of volume extensions and shapes.

Another technique of epitaxial growth than CVD, such as LPE, is also conceivable and within the scope of the present invention.

I claim:

1. A method for producing a bipolar semiconductor device having a first layer doped with a first doping type being one of n and p, said first layer being adapted to have minority charge carriers injected thereinto from a second layer of the device with a doping type opposite to that of the first layer in a forward conducting state of the device, said method comprising the steps of a) epitaxially growing said first layer and b) providing at least one region of said first layer with said minority charge carriers having a lifetime lower than in other parts of said first layer, said lower lifetime region of said first layer being formed directly during the epitaxial growth of this region by changing composition of substances fed to said first layer for the growth thereof when said region is grown.

2. A method according to claim 1, wherein said lower lifetime region is formed by incorporating impurities thereinto during the growth thereof.

3. A method according to claim 1, wherein the ratio of substances that contain basic elements for the growth of said first layer is changed during the growth of said region.

4. A method according to claim 2, wherein said region is formed by incorporating impurities during the growth of a certain thickness of said first layer, so that said lower lifetime region becomes a sub-layer of said first layer.

5. A method according to claim 1, wherein said second layer is located next to said first layer, and said lower lifetime region is grown in a part of said first layer located close to said second layer.

6. A method according to claim 1, wherein a lifetime of said minority charge carriers varies throughout said first layer.

7. A method according to claim 6, wherein said lifetime is varied by incorporating impurities thereinto with one of a) a concentration varying throughout said first layer, b) a composition varying throughout said first layer and c) both a) and b).

8. A method according to claim 1, wherein at least said first layer is produced by epitaxially growing SiC.

9. A method according to claim 3, wherein the C/Si-ratio of said substances is changed during the growth of said first layer.

10. A method according to claim 1, wherein at least said first layer is grown by Chemical Vapor Deposition (CVD).

11. A method according to claim 1, wherein said lower lifetime region is created in a first layer which is a low doped drift layer of said device.

12. A method according to claim 1, wherein said first layer is grown as an n-type layer.

13. A method according to claim 8, wherein one of a) titanium and b) vanadium is incorporated as a compensating acceptor in said region during the growth thereof for lowering said lifetime therein.

14. A method according to claim 11, wherein said first layer is epitaxially grown with a very low doping concentration to keep the minority charge carrier lifetime thereof as high as possible except during the growth of a specific thickness interval of said first layer for which additives reducing said lifetime are introduced.

15. A method according to claim 1, wherein said lower lifetime region has a lifetime of said minority charge carriers at least five times lower than in the major part of first said layer.

16. A method according to claim 1, wherein said region is thinner than the first layer.

17. A method according to claim 16, wherein said region is thinner than ⅓ of the thickness of said first layer.

18. A method according to claim 2, wherein impurities strongly enhancing the recombination rate of said minority charge carriers are incorporated in said region p during the epitaxial growth thereof.

* * * * *